United States Patent
Byrne et al.

(10) Patent No.: US 11,212,429 B2
(45) Date of Patent: *Dec. 28, 2021

(54) CAMERA MODULE FOR VEHICULAR VISION SYSTEM

(71) Applicant: Magna Electronics Inc., Auburn Hills, MI (US)

(72) Inventors: Steven V. Byrne, Goodrich, MI (US); Yuesheng Lu, Farmington Hills, MI (US); Jonathan D. Conger, Berkley, MI (US); Rene Dreiocker, Rochester Hills, MI (US)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/947,775

(22) Filed: Aug. 17, 2020

(65) Prior Publication Data

US 2020/0382682 A1 Dec. 3, 2020

Related U.S. Application Data

(63) Continuation of application No. 16/165,170, filed on Oct. 19, 2018, now Pat. No. 10,750,064.

(60) Provisional application No. 62/575,650, filed on Oct. 23, 2017.

(51) Int. Cl.
*H04N 5/225* (2006.01)
*H05K 7/20* (2006.01)
*B60R 1/00* (2006.01)

(52) U.S. Cl.
CPC ............. *H04N 5/2253* (2013.01); *B60R 1/00* (2013.01); *H04N 5/2252* (2013.01); *H04N 5/2257* (2013.01); *H04N 5/22521* (2018.08); *H05K 7/205* (2013.01); *H05K 7/20409* (2013.01);
(Continued)

(58) Field of Classification Search
CPC ............... H04N 5/2253; H04N 5/2257; H04N 5/22521; H04N 5/2252; B60R 1/00; B60R 2300/105; H05K 7/20854; H05K 7/205; H05K 7/20409
See application file for complete search history.

(56) References Cited

U.S. PATENT DOCUMENTS

| 5,550,677 A | 8/1996 | Schofield et al. |
| 5,670,935 A | 9/1997 | Schofield et al. |
| 5,949,331 A | 9/1999 | Schofield et al. |

(Continued)

*Primary Examiner* — Twyler L Haskins
*Assistant Examiner* — Angel L Garces-Rivera
(74) *Attorney, Agent, or Firm* — Honigman LLP

(57) ABSTRACT

A camera module for a vehicular vision system includes a front camera housing having a housing portion and a cylindrical lens barrel extending from the housing portion and accommodating a lens. An imager printed circuit board is attached at the front camera housing portion. With the imager printed circuit board attached at the front camera housing, the imager is optically aligned with an optical axis of the lens. A rear camera housing portion is mated with the housing portion of the front camera housing so as to encase the imager printed circuit board in the camera module. The housing portion of the front camera housing includes mounting structure configured to mount the camera module at a vehicle. The lens barrel includes a material having a lower coefficient of thermal expansion as compared to the material of the front camera housing.

25 Claims, 2 Drawing Sheets

(52) U.S. Cl.
CPC .... *H05K 7/20854* (2013.01); *B60R 2300/105* (2013.01)

(56) References Cited

U.S. PATENT DOCUMENTS

| | | |
|---|---|---|
| 7,038,577 B2 | 5/2006 | Pawlicki et al. |
| 7,720,580 B2 | 5/2010 | Higgins-Luthman |
| 7,855,755 B2 | 12/2010 | Weller et al. |
| 7,965,336 B2 | 6/2011 | Bingle et al. |
| 8,542,451 B2 | 9/2013 | Lu et al. |
| 8,994,878 B2 | 3/2015 | Byrne et al. |
| 9,077,098 B2 | 7/2015 | Latunski |
| 9,277,104 B2 | 3/2016 | Sesti et al. |
| 9,596,387 B2 | 3/2017 | Achenbach et al. |
| 9,621,769 B2 | 4/2017 | Mai et al. |
| 10,750,064 B2 * | 8/2020 | Byrne ............... H05K 7/205 |
| 2009/0244361 A1 | 10/2009 | Gebauer et al. |
| 2012/0019940 A1 | 1/2012 | Lu et al. |
| 2013/0242099 A1 | 9/2013 | Sauer et al. |
| 2014/0373345 A1 | 12/2014 | Steigerwald |
| 2015/0015713 A1 | 1/2015 | Wang et al. |
| 2015/0124098 A1 | 5/2015 | Winden et al. |
| 2015/0222795 A1 | 8/2015 | Sauer et al. |
| 2015/0327398 A1 | 11/2015 | Achenbach et al. |
| 2015/0379361 A1 | 12/2015 | Boulanger |
| 2016/0037028 A1 | 2/2016 | Biemer |
| 2016/0243987 A1 | 8/2016 | Kendall |
| 2016/0268716 A1 | 9/2016 | Conger et al. |
| 2016/0286103 A1 | 9/2016 | Van Dan Elzen |
| 2017/0048463 A1 | 2/2017 | Mleczko |
| 2017/0054881 A1 | 2/2017 | Conger et al. |
| 2017/0133811 A1 | 5/2017 | Conger et al. |
| 2017/0201661 A1 | 7/2017 | Conger |
| 2017/0280034 A1 | 9/2017 | Hess et al. |
| 2017/0295306 A1 | 10/2017 | Mleczko |
| 2017/0302829 A1 | 10/2017 | Mleczko et al. |
| 2018/0072239 A1 | 3/2018 | Wienecke et al. |
| 2018/0098033 A1 | 4/2018 | Mleczko et al. |
| 2019/0121051 A1 | 4/2019 | Byrne et al. |
| 2019/0124238 A1 | 4/2019 | Byrne et al. |
| 2019/0124243 A1 | 4/2019 | Mleczko et al. |
| 2019/0306966 A1 | 10/2019 | Byrne et al. |

* cited by examiner

CAMERA MODULE FOR VEHICULAR VISION SYSTEM

CROSS REFERENCE TO RELATED APPLICATIONS

The present application is a continuation of U.S. patent application Ser. No. 16/165,170, filed Oct. 19, 2018, now U.S. Pat. No. 10,750,064, which claims the filing benefits of U.S. provisional application Ser. No. 62/575,650, filed Oct. 23, 2017, which is hereby incorporated herein by reference in its entirety.

FIELD OF THE INVENTION

The present invention relates generally to a vehicle vision system for a vehicle and, more particularly, to a vehicle vision system that utilizes one or more cameras at a vehicle.

BACKGROUND OF THE INVENTION

Use of imaging sensors in vehicle imaging systems is common and known. Examples of such known systems are described in U.S. Pat. Nos. 5,949,331; 5,670,935 and/or 5,550,677, which are hereby incorporated herein by reference in their entireties. Various cameras have been proposed for such imaging systems, including cameras of the types described in U.S. Pat. No. 7,965,336 and U.S. Publication No. US-2009-0244361, which are hereby incorporated herein by reference in their entireties.

SUMMARY OF THE INVENTION

The present invention provides a vision system or imaging system for a vehicle that utilizes one or more cameras to capture image data representative of images exterior of the vehicle. The camera or camera module comprises an imager and a circuit board (or circuit boards) and a lens. The lens comprises a plurality of optical elements fixedly disposed in a lens barrel. A front camera housing portion is configured to receive an imager printed circuit board therein, with the imager printed circuit board disposed at the lens barrel and bonded thereat with the imager optically aligned with an optical axis of the optical elements. The lens barrel and the front camera housing portion are integrally formed together as a single part. The front camera housing portion includes mounting structure configured to mount the camera module at a vehicle. A rear camera housing portion is mated with a rear portion of the front camera housing so as to encase and seal the imager printed circuit board in the camera module. The mounting structure is formed as part of the front camera housing so as to be evenly or centrally located about the optical axis and about a center of mass of the camera module. Circuitry of the camera module is electrically connected to the imager and is electrically connected to electrical connecting elements that are configured to electrically connect to a wire harness of the vehicle.

Optionally, the rear camera housing portion may comprise a heat sink. Optionally, the optic elements may be fixedly bonded to the lens barrel.

These and other objects, advantages, purposes and features of the present invention will become apparent upon review of the following specification in conjunction with the drawings.

DESCRIPTION OF THE PREFERRED EMBODIMENTS

A vehicle vision system and/or driver assist system and/or object detection system and/or alert system operates to capture images exterior of the vehicle and may process the captured image data to display images and to detect objects at or near the vehicle and in the predicted path of the vehicle, such as to assist a driver of the vehicle in maneuvering the vehicle in a rearward direction. The vision system includes an image processor or image processing system that is operable to receive image data from one or more cameras and provide an output to a display device for displaying images representative of the captured image data. Optionally, the vision system may provide display, such as a rearview display or a top down or bird's eye or surround view display or the like.

Figure 1:
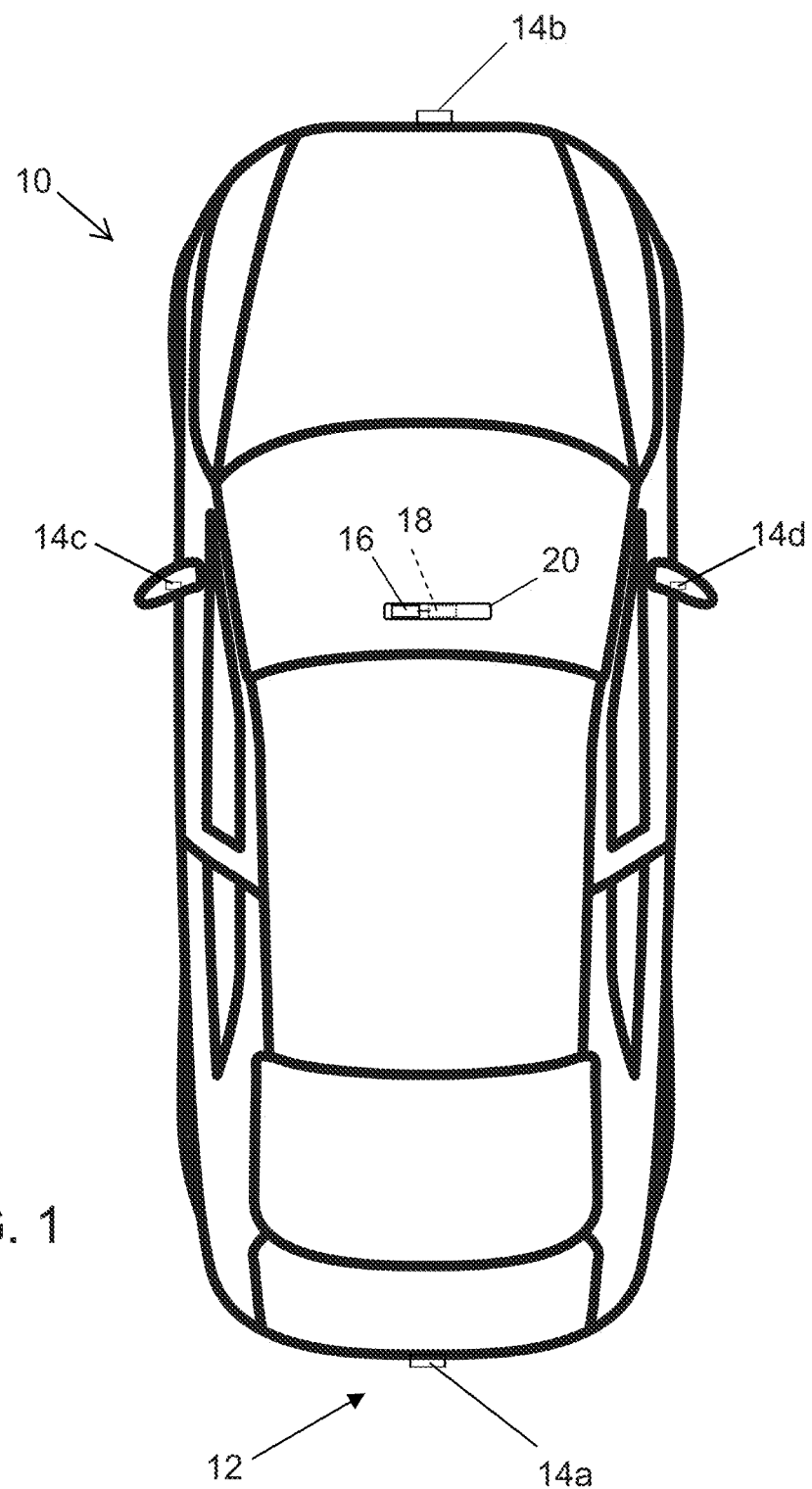
FIG. 1 is a plan view of a vehicle with a vision system that incorporates cameras in accordance with the present invention.

Referring now to the drawings and the illustrative embodiments depicted therein, a vehicle 10 includes an imaging system or vision system 12 that includes at least one exterior facing imaging sensor or camera, such as a rearward facing imaging sensor or camera 14a (and the system may optionally include multiple exterior facing imaging sensors or cameras, such as a forward facing camera 14b at the front (or at the windshield) of the vehicle, and a sideward/rearward facing camera 14c, 14d at respective sides of the vehicle), which captures images exterior of the vehicle, with the camera having a lens for focusing images at or onto an imaging array or imaging plane or imager of the camera (FIG. 1). Optionally, a forward viewing camera may be disposed at the windshield of the vehicle and view through the windshield and forward of the vehicle, such as for a machine vision system (such as for traffic sign recognition, headlamp control, pedestrian detection, collision avoidance, lane marker detection and/or the like). The vision system 12 includes a control or electronic control unit (ECU) or processor 18 that is operable to process image data captured by the camera or cameras and may detect objects or the like and/or provide displayed images at a display device 16 for viewing by the driver of the vehicle (although shown in FIG. 1 as being part of or incorporated in or at an interior rearview mirror assembly 20 of the vehicle, the control and/or the display device may be disposed elsewhere at or in the vehicle). The data transfer or signal communication from the camera to the ECU may comprise any suitable data or communication link, such as a vehicle network bus or the like of the equipped vehicle.

The control unit may comprise or may be part of an autonomous vehicle control system, whereby the cameras capture image data that is processed for use in autonomously controlling the vehicle. Optical axis alignment and focus requirements are very precise for autonomous vehicle cameras. Typical automotive cameras require that they maintain alignment to within +/−1 degree, whereas autonomous vehicle cameras may have requirements that are hundreds of times smaller. Also, typical cameras may have a greater than about 40 µm range of focus, whereas autonomous vehicle cameras may have less than about 10 µm range of focus.

Cameras comprise many interfacing components along the optical axis which may shift when exposed to thermal changes, vibrations or mechanical shocks. Some typical interfaces include: (1) Lens elements-to-lens barrel, (2) Lens barrel-to-lens holder, (3) Lens holder-to-image sensor PCB, (4) Lens holder-to-camera front housing, (5) Camera front housing-to-camera rear housing and mounting features, and/or (6) Camera rear housing mounting features to Camera bracket. Each of these contribute to the current alignment and focus tolerance expected for standard automotive cameras today.

The "high precision camera" of the present invention minimizes alignment and focus change. For example, while lens elements are typically placed within a "barrel" with some small amount of clearance and held in place with a compression force, the camera of the present invention has its lens elements permanently bonded in place in the lens barrel to prevent shifting.

Also, the camera directly adhesively bonds the image sensor PCB (printed circuit board) at the lens or lens barrel. To eliminate all sources of movement between the lens and image sensor, the imager or its printed circuit board is bonded directly to the lens structure or lens barrel, such as via a suitable quick-cure adhesive (see FIG. 2). The bonding adhesive also acts as the pliable assembly element or member between the optics and the imager or imaging sensor for the focus and alignment steps (and then cures to a cured state that retains the imager PCB and imager relative to the lens barrel and lens). For example, the adhesive and focus and alignment steps may utilize aspects of the cameras and processes described in U.S. Pat. Nos. 8,542,451 and 9,277,104, which are hereby incorporated herein by reference in their entireties. For example, the adhesive and focus and alignment steps may utilize aspects of the cameras and processes described in U.S. Pat. Nos. 8,542,451 and 9,277,104, which are hereby incorporated herein by reference in their entireties.

The camera also includes a unified lens and camera body structure. To eliminate the lens-to-camera body structure interface, these are a single piece or single construction. The lens barrel structure is extended to also become the camera body and includes the camera mounting features (that mount the camera at the vehicle, such as via fasteners or the like).

The structural rigidity and load balance or load symmetry are important for maintaining the camera's aim during dynamic conditions such as vehicle vibration. Thus, the mounting features are evenly or centrally located about the camera optical axis and center of mass of the camera.

Symmetrical heat distribution about the optical axis or key structures of the camera also becomes very important for these high levels of precession. The camera of the present invention is designed to evenly distribute heat about the optical axis and includes sources of heat dissipation, such as cooling fins or mounting features, positioned to do the same. This typically means being symmetrically positioned as well as possible round the optical axis.

If required for athermalization, the lens barrel may be constructed from a material with a lower CTE (coefficient of thermal expansion), such as titanium or the like, or a higher CTE, such as a zinc alloy or the like, to provide a focus CTE that is selected to maintain focus of images at the imager in varying temperatures. Optionally, a bridge member may be included between the lens barrel and image sensor to compensate for thermal effects. Such a bridge member may be permanently bonded to the lens barrel.

The camera may reduce moisture air in the camera module or body by way of desiccant, nitrogen bath assembly or other gas to prevent internal condensation on cooled components. Optionally, for example, a desiccant sheet with adhesive backing may be used. Optionally, a heat spreader, such as one made from graphite (such as a graphite sheet or layer or film, or such as another suitable heat spreading or heat diffusing sheet or layer or film, such as, for example, a graphene sheet or layer or film or the like), may be used to enhance the rear cover sink ability.

Figure 2:
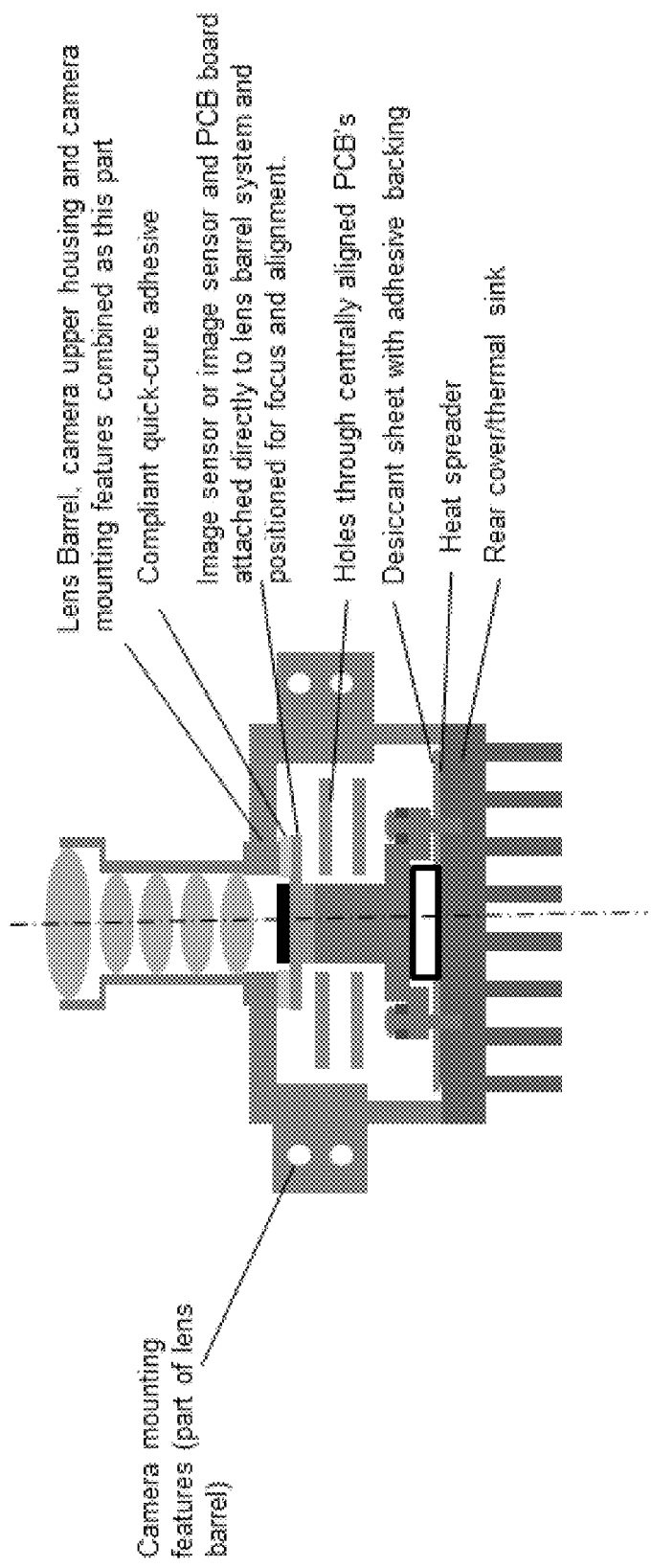
FIG. 2 is a sectional view of a camera module in accordance with the present invention.

Thus, and such as shown in FIG. 2, the camera module of the present invention includes a lens barrel and camera upper or front housing portion that are formed as a single or unitary part (such as via injection molding of a plastic material). The lens optics are fixed or bonded in the lens barrel and the imager (or imager PCB) is adhered or bonded or attached (such as via a compliant quick-cure adhesive) directly to the lens barrel system and positioned for focus and alignment. The camera mounting features (that are configured to mount or attach the camera at the vehicle) are formed as part of the lens barrel and housing portion and are located about the camera optical axis and center of mass of the camera.

In the illustrated embodiment, the camera module includes two printed circuit boards (in addition to the imager PCB) that include circuitry associated with the imager and camera. Circuitry of the PCBs and of the camera module is electrically connected to the imager and is electrically connected to electrical connecting elements that are configured to electrically connect to a wire harness of the vehicle. One of the PCBs may include an image processor disposed thereat. The thermal element may be in contact with the PCB having the processor, and may be in contact at or the processor, so as to draw heat generated by the processor away from the processor and its PCB and toward the rear of the camera housing. For example, the thermal element may engage the rear surface of the processor PCB at or near or opposite from the processor.

As shown in FIG. 2, the thermal element is in thermal conductive contact with the rear housing or cover and the heat sink, and extends therefrom into the cavity of the camera module. The end of the thermal element that is distal from the rear housing is in thermal contact with the imager PCB (at the rear or opposite side of the imager PCB from where the imager is disposed). The thermal element protrudes through an aperture or hole through one or more other PCBs, which are centrally aligned with the axis of the camera module and lens assembly. The desiccant sheet and/or heat spreader may be disposed at the interior surface of the rear housing portion and between the rear housing portion and the thermal element (which may be fastened to the rear housing portion via fasteners or the like) to spread the heat conducted by the thermal element (drawn from the PCB(s)) over the rear housing portion and heat sink to enhance cooling of the camera module during operation.

The camera module may utilize aspects of the cameras and connectors described in U.S. Pat. Nos. 9,621,769; 9,596,387; 9,277,104; 9,077,098; 8,994,878; 8,542,451 and/or 7,965,336, and/or U.S. Publication Nos. US-2009-0244361; US-2013-0242099; US-2014-0373345; US-2015-0124098; US-2015-0222795; US-2015-0327398; US-2016-0243987; US-2016-0268716; US-2016-0286103; US-2016-0037028; US-2017-0054881; US-2017-0133811; US-2017-0201661; US-2017-0280034; US-2017-0295306; US-2017-0302829 and/or US-2018-0098033, and/or U.S. patent applications, Ser. No. 16/165,204, filed Oct. 19, 2018, and published on Apr. 25, 2019 as U.S. Publication No. US-2019-0124243, and/or Ser. No. 16/165,253, filed Oct. 19, 2018, now U.S. Pat. No. 10,678,018, which are hereby incorporated herein by reference in their entireties.

The camera or sensor may comprise any suitable camera or sensor. Optionally, the camera may comprise a "smart camera" that includes the imaging sensor array and associated circuitry and image processing circuitry and electrical connectors and the like as part of a camera module, such as by utilizing aspects of the vision systems described in International Publication Nos. WO 2013/081984 and/or WO 2013/081985, which are hereby incorporated herein by reference in their entireties.

The system includes an image processor operable to process image data captured by the camera or cameras, such as for detecting objects or other vehicles or pedestrians or the like in the field of view of one or more of the cameras. For example, the image processor may comprise an image processing chip selected from the EYEQ™ family of image processing chips available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

For example, the vision system and/or processing and/or camera and/or circuitry may utilize aspects described in U.S. Pat. Nos. 9,233,641; 9,146,898; 9,174,574; 9,090,234; 9,077,098; 8,818,042; 8,886,401; 9,077,962; 9,068,390; 9,140,789; 9,092,986; 9,205,776; 8,917,169; 8,694,224; 7,005,974; 5,760,962; 5,877,897; 5,796,094; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 6,636,258; 7,145,519; 7,161,616; 7,230,640; 7,248,283; 7,295,229; 7,301,466; 7,592,928; 7,881,496; 7,720,580; 7,038,577; 6,882,287; 5,929,786 and/or 5,786,772, and/or U.S. Publication Nos. US-2014-0340510; US-2014-0313339; US-2014-0347486; US-2014-0320658; US-2014-0336876; US-2014-0307095; US-2014-0327774; US-2014-0327772; US-2014-0320636; US-2014-0293057; US-2014-0309884; US-2014-0226012; US-2014-0293042; US-2014-0218535; US-2014-0218535; US-2014-0247354; US-2014-0247355; US-2014-0247352; US-2014-0232869; US-2014-0211009; US-2014-0160276; US-2014-0168437; US-2014-0168415; US-2014-0160291; US-2014-0152825; US-2014-0139676; US-2014-0138140; US-2014-0104426; US-2014-0098229; US-2014-0085472; US-2014-0067206; US-2014-0049646; US-2014-0052340; US-2014-0025240; US-2014-0028852; US-2014-005907; US-2013-0314503; US-2013-0298866; US-2013-0222593; US-2013-0300869; US-2013-0278769; US-2013-0258077; US-2013-0258077; US-2013-0242099; US-2013-0215271; US-2013-0141578 and/or US-2013-0002873, which are all hereby incorporated herein by reference in their entireties. The system may communicate with other communication systems via any suitable means, such as by utilizing aspects of the systems described in International Publication Nos. WO/2010/144900; WO 2013/043661 and/or WO 2013/081985, and/or U.S. Pat. No. 9,126,525, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A camera module for a vehicular vision system, said camera module comprising:
   a front camera housing comprising a housing portion and a cylindrical lens barrel extending from said housing portion;
   a lens comprising a plurality of optical elements accommodated in said lens barrel;
   an imager printed circuit board accommodated in said front camera housing, said imager printed circuit board having an imager disposed thereat;
   wherein said imager printed circuit board is attached at the front camera housing;
   wherein, with said imager printed circuit board attached at the front camera housing, said imager is optically aligned with an optical axis of said lens;
   wherein said housing portion of said front camera housing includes mounting structure configured to mount said camera module at a vehicle;
   a rear camera housing mated with said housing portion of said front camera housing so as to encase said imager printed circuit board in said camera module; and
   wherein said lens barrel comprises a material having a lower coefficient of thermal expansion as compared to the material of the front camera housing.

2. The camera module of claim 1, wherein circuitry of said camera module is electrically connected to said imager and is electrically connected to electrical connecting elements that are configured to electrically connect to a wire harness of the vehicle when said mounting structure mounts said camera module at the vehicle.

3. The camera module of claim 1, wherein said camera module is configured to be disposed at an exterior portion of the vehicle so as to have a field of view exterior of the vehicle.

4. The camera module of claim 1, wherein said rear camera housing comprises a heat sink.

5. The camera module of claim 4, comprising a heat transfer element that is in contact with said heat sink of said rear camera housing and that is in contact with a rear side of said imager printed circuit board opposite from said imager.

6. The camera module of claim 1, wherein said imager printed circuit board evenly distributes heat about the optical axis of said optical elements.

7. The camera module of claim 1, wherein said imager printed circuit board and at least one other printed circuit board evenly distribute heat about the optical axis of said optical elements.

8. The camera module of claim 1, wherein said optical elements are bonded to an internal surface of said lens barrel.

9. The camera module of claim 1, comprising a bridge member between said lens barrel and said imager printed circuit board to accommodate different amounts of thermal expansion of components of said camera module.

10. The camera module of claim 1, comprising a moisture reducing element that limits internal condensation at cooled components of said camera module.

11. The camera module of claim 10, comprising a heat spreading material disposed between the moisture reducing element and an internal surface of said rear camera housing.

12. The camera module of claim 1, wherein said front camera housing comprises a plastic material.

13. A camera module for a vehicular vision system, said camera module comprising:

a front camera housing comprising a housing portion and a cylindrical lens barrel extending from said housing portion;

a lens comprising a plurality of optical elements accommodated in said lens barrel;

an imager printed circuit board accommodated in said front camera housing, said imager printed circuit board having an imager disposed thereat;

wherein said imager printed circuit board is attached at the front camera housing;

wherein, with said imager printed circuit board attached at the front camera housing, said imager is optically aligned with an optical axis of said lens;

wherein said housing portion of said front camera housing includes mounting structure configured to mount said camera module at a vehicle;

a rear camera housing mated with said housing portion of said front camera housing so as to encase said imager printed circuit board in said camera module;

wherein said lens barrel comprises a material having a lower coefficient of thermal expansion as compared to the material of the front camera housing;

wherein circuitry of said camera module is electrically connected to said imager and is electrically connected to electrical connecting elements that are configured to electrically connect to a wire harness of the vehicle when said mounting structure mounts said camera module at the vehicle; and wherein said camera module is configured to be disposed at an exterior portion of the vehicle so as to have a field of view exterior of the vehicle.

14. The camera module of claim 13, wherein said rear camera housing comprises a heat sink.

15. The camera module of claim 14, comprising a heat transfer element that is in contact with said heat sink of said rear camera housing and that is in contact with a rear side of said imager printed circuit board opposite from said imager.

16. The camera module of claim 13, wherein said optical elements are bonded to an internal surface of said lens barrel.

17. The camera module of claim 13, comprising a bridge member between said lens barrel and said imager printed circuit board to accommodate different amounts of thermal expansion of components of said camera module.

18. The camera module of claim 13, comprising a moisture reducing element that limits internal condensation at cooled components of said camera module.

19. The camera module of claim 18, comprising a heat spreading material disposed between the moisture reducing element and an internal surface of said rear camera housing.

20. The camera module of claim 13, wherein said front camera housing comprises a plastic material.

21. A camera module for a vehicular vision system, said camera module comprising:

a front camera housing comprising a housing portion and a cylindrical lens barrel extending from said housing portion;

a lens comprising a plurality of optical elements accommodated in said lens barrel;

an imager printed circuit board accommodated in said front camera housing, said imager printed circuit board having an imager disposed thereat;

wherein said imager printed circuit board is attached at the front camera housing;

wherein, with said imager printed circuit board attached at the front camera housing, said imager is optically aligned with an optical axis of said lens;

wherein said housing portion of said front camera housing includes mounting structure configured to mount said camera module at a vehicle;

a rear camera housing mated with said housing portion of said front camera housing so as to encase said imager printed circuit board in said camera module;

a heat transfer element that is in contact with said rear camera housing and that is in contact with a rear side of said imager printed circuit board opposite from said imager;

wherein said lens barrel comprises a material having a lower coefficient of thermal expansion as compared to the material of the front camera housing; and wherein circuitry of said camera module is electrically connected to said imager and is electrically connected to electrical connecting elements that are configured to electrically connect to a wire harness of the vehicle when said mounting structure mounts said camera module at the vehicle.

22. The camera module of claim 21, comprising a bridge member between said lens barrel and said imager printed circuit board to accommodate different amounts of thermal expansion of components of said camera module.

23. The camera module of claim 21, comprising a moisture reducing element that limits internal condensation at cooled components of said camera module.

24. The camera module of claim 23, comprising a heat spreading material disposed between the moisture reducing element and an internal surface of said rear camera housing.

25. The camera module of claim 21, wherein said front camera housing comprises a plastic material.

\* \* \* \* \*